United States Patent
Lu et al.

(10) Patent No.: US 10,284,010 B2
(45) Date of Patent: May 7, 2019

(54) MODULAR UNINTERRUPTIBLE POWER SUPPLY SYSTEM

(71) Applicant: VOLTRONIC POWER TECHNOLOGY CORP., Taipei (TW)

(72) Inventors: Yu-Cheng Lu, Taipei (TW); Tao Liu, Shenzhen (CN); Bo Zhou, Shenzhen (CN); Juor-Ming Hsieh, Taipei (TW)

(73) Assignee: VOLTRONIC POWER TECHNOLOGY CORP., Taipei (TW)

( * ) Notice: Subject to any disclaimer, the term of this patent is extended or adjusted under 35 U.S.C. 154(b) by 147 days.

(21) Appl. No.: 15/656,201

(22) Filed: Jul. 21, 2017

(65) Prior Publication Data
US 2018/0316215 A1 Nov. 1, 2018

(30) Foreign Application Priority Data
Apr. 28, 2017 (CN) .................... 2017 2 0473031 U

(51) Int. Cl.
H02J 9/06 (2006.01)
H05K 7/20 (2006.01)
H05K 7/18 (2006.01)
H05K 7/14 (2006.01)
H05K 5/00 (2006.01)

(52) U.S. Cl.
CPC ............ *H02J 9/061* (2013.01); *H05K 7/1492* (2013.01); *H05K 7/183* (2013.01); *H05K 7/2089* (2013.01)

(58) Field of Classification Search
CPC ....... H02J 9/061; H05K 7/1492; H05K 7/183; H05K 7/2089; H05K 5/00
See application file for complete search history.

(56) References Cited

U.S. PATENT DOCUMENTS

2005/0162836 A1* 7/2005 Briggs .................... G06F 1/181
361/724

* cited by examiner

*Primary Examiner* — Robert L Deberadinis
(74) *Attorney, Agent, or Firm* — Li & Cai Intellectual Property (USA) Office

(57) ABSTRACT

A modular uninterruptible power supply (UPS) system includes a housing having a plurality of slots, wherein a power module or a battery module can be selectively inserted into each of the slots; each of the slots is selectively disposed with a first connector and a second connector or only with the second connector; the back of the power module is disposed with a first connecting module and a second connecting module, and the first connecting module and the second connecting module are electrically connected to the first connector and the second connector when the power module is inserted into the slots; the back of the battery module is disposed with a second connecting module, and the second connecting module is electrically connected to the second connector.

12 Claims, 11 Drawing Sheets

MODULAR UNINTERRUPTIBLE POWER SUPPLY SYSTEM

BACKGROUND

1. Technical Field

The present disclosure is related to a modular uninterruptible power supply (UPS) system, in particular, to a modular uninterruptible power supply (UPS) system for a rackmount type in the communication industry.

2. Description of Related Art

Computer devices and automation equipment are widely used in data centers of the communications industry and control centers of public transport facilities such as metro, highway and high-speed rail. A stable uninterrupted power supply is the basic requirement for maintaining the normal operation of these computer devices and automation equipment. However, power pressure drops and power interruption often occur in the public power systems due to the disconnection of transmission lines and short circuit accidents.

The uninterruptible power supply system is mainly composed of two types of modules. One is a power module, and the other is a battery module. The battery module is mainly used to store electricity, and the power module is mainly used to transform direct current into alternating current, and then output the alternating current for use, while controlling the charge of the battery module.

For the industrial uninterruptible power supply (UPS) system users, it is necessary to adjust and plan the number of power modules and battery modules according to the energy consumption and the number of external devices to meet various demands.

However, the connection interface of existing power modules is different from that of existing battery modules, and so are the shapes and sizes thereof. In addition, the space for accommodating the power module is incompatible with that for accommodating the battery module. Therefore, the power module and the battery module are unable to be installed into slots of the same housing. That is, the structure of housing has to be re-designed once the number of power modules and battery modules changes, which would result in inconvenience for the UPS system users and lower operating flexibility.

Therefore, there is still room for improvement in the design of conventional UPS systems.

SUMMARY

The object of the present disclosure is to provide an adjustable modular uninterruptible power supply system which is capable of meeting actual needs.

In order to achieve the aforementioned object, according to one embodiment of the present disclosure, a modular uninterruptible power supply (UPS) system is provided. The modular UPS system includes a housing, at least one power module, at least one battery module, a plurality of first connectors and a plurality of second connectors. Further, a plurality of slots are disposed in the housing. The at least one power module is selectively inserted into one of the plurality of slots, and the at least one battery module is selectively inserted into one of the plurality of slots. Each of the first connectors is selectively disposed in each of the slots, and each of the second connectors is individually disposed in each of the slots. The slot which accommodates the at least one power module is defined as a first type slot, and the slot which accommodates the at least one battery module is defined as a second type slot. The first type slot is disposed with one first connector and one second connector, and the second type slot is disposed with one second connector of which a position corresponds to a position of the second connector in the first type slot. The at least one power module is disposed with a first connecting module and a second connecting module corresponding to the first connector and the second connector, respectively. Further, the first connecting module is electrically connected to the first connector, and the second connecting module is electrically connected to the second connector when the at least one power module is inserted into one of the slots. The at least one battery module is disposed with a second connecting module corresponding to the second connector; the second connecting module on the at least one battery module is electrically connected to the second connector when the at least one battery module is inserted into one of the slots.

In order to achieve the aforementioned object, according to another embodiment of the present disclosure, a modular uninterruptible power supply (UPS) system is provided. The modular UPS system includes a housing, at least one power module and at least one battery module. The housing is disposed with a plurality of slots, and a first connector and a second connector are respectively disposed in each of the slots. The at least one power module is selectively inserted into one of the plurality of slots, and the at least one battery module is selectively inserted into one of the plurality of slots. The at least one power module is disposed with a first connecting module and a second connecting module corresponding to the first connector and the second connector, respectively. The first connecting module is electrically connected to the first connector, and the second connecting module is electrically connected to the second connector when the at least one power module is inserted into one of the slots. The at least one battery module is disposed with a second connecting module corresponding to the second connector; the second connecting module on the at least one battery module is electrically connected to the second connector when the at least one battery module is inserted into one of the slots.

To sum up, the advantages of the present disclosure are that the modular uninterruptible power supply (UPS) system can increase the operating flexibility and allow the modular UPS system to be upgraded easily without changing the structure of the housing and slots when accommodating a different number of the power modules and the battery modules.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
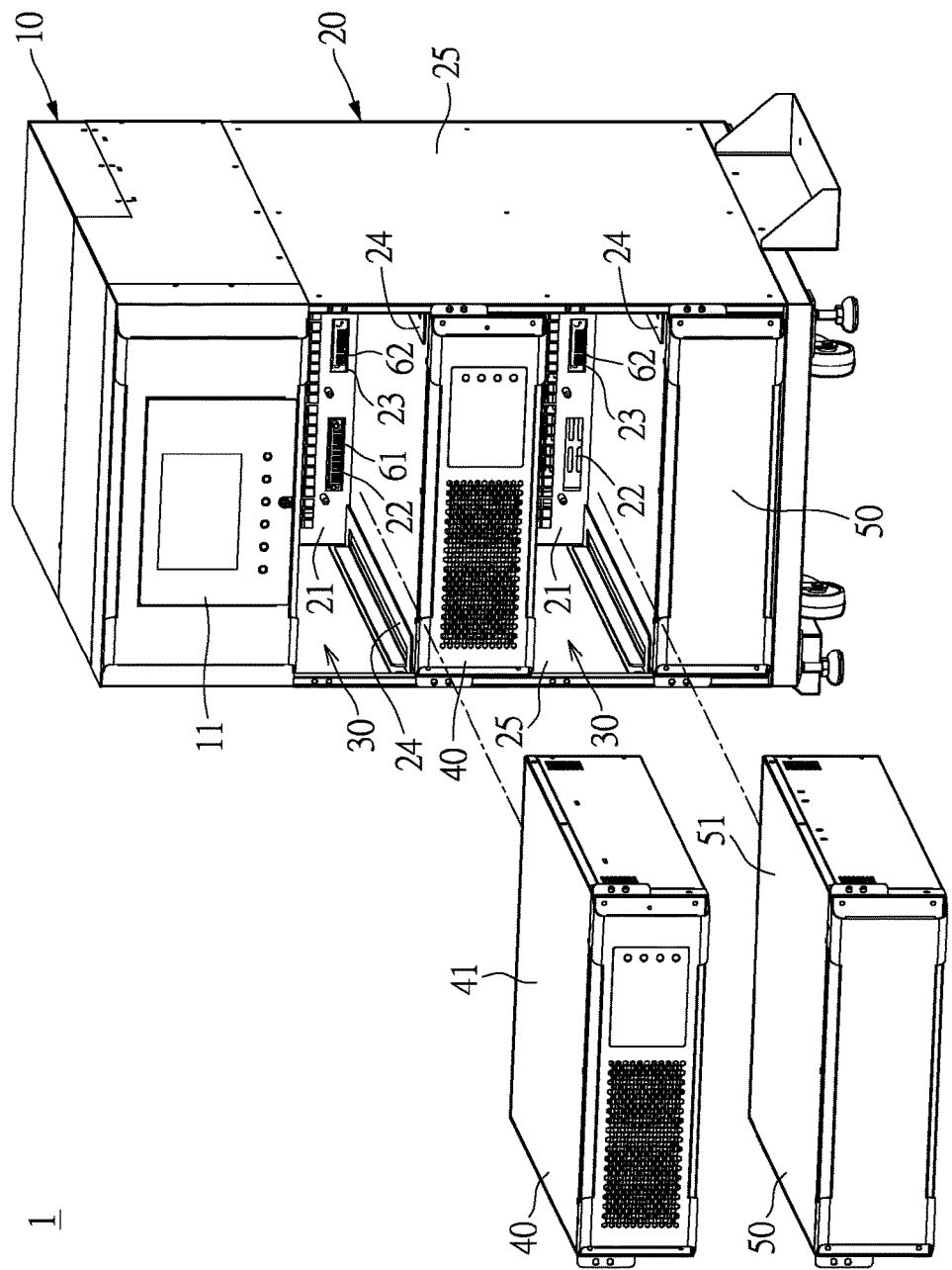
FIG. 1 is a three-dimensional exploded view of the modular uninterruptible power supply (UPS) system according to a first embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts. The present disclosure may be implemented or applied by various specific embodiments, and the details in this specification may be varied and modified without departing from the spirit of the present disclosure based on different views and applications. The drawings of the present disclosure are simply illustrative and are not depicted in terms of actual dimensions. The following description will further illustrate the related technical contents of the present disclosure, and should not be construed as restricting the technical scope of the present disclosure.

Figure 2:
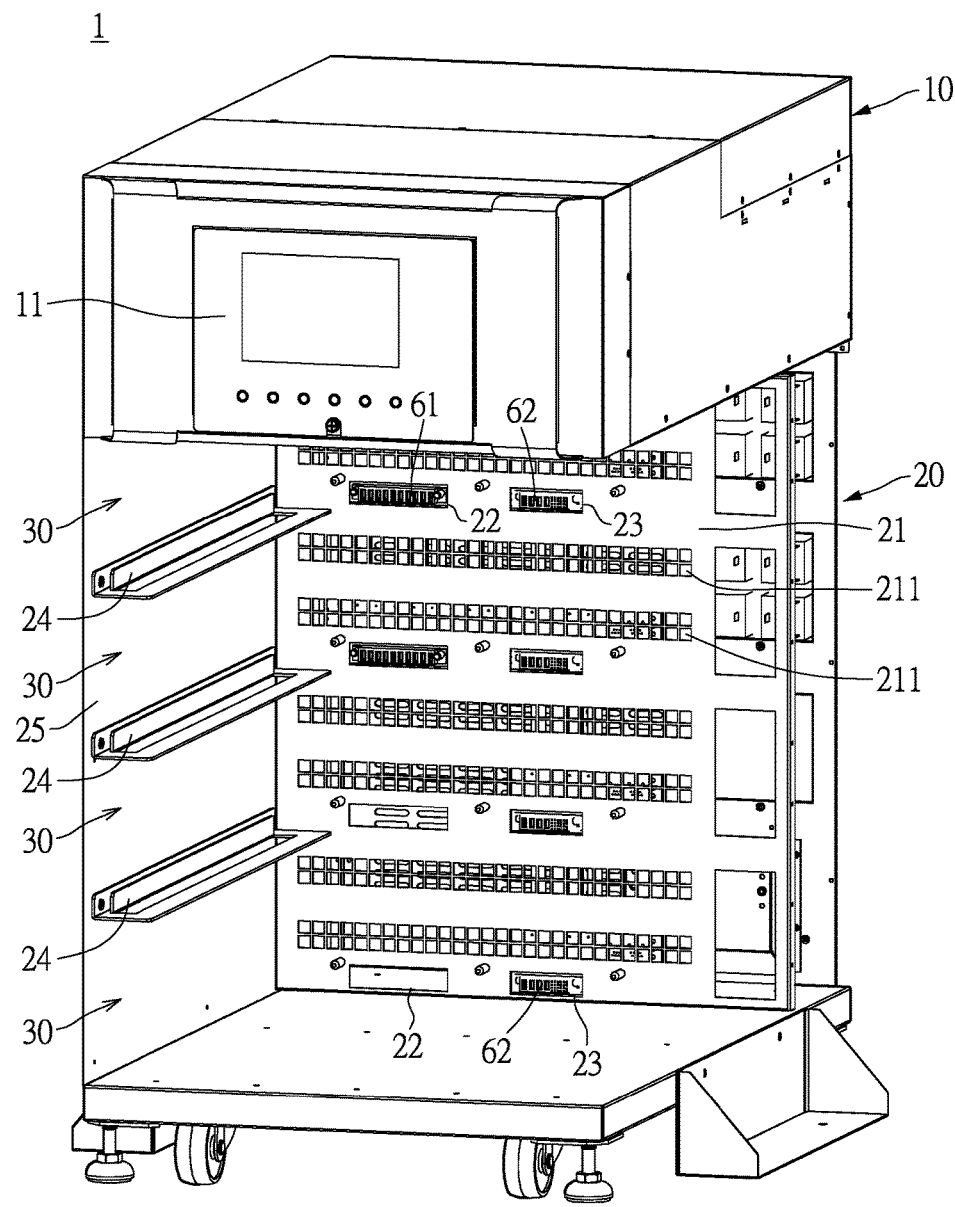
FIG. 2 is a three-dimensional view of the modular UPS system in which the power module, the battery module and a part of the side wall of the housing are removed according to the first embodiment of the present disclosure.

As shown in FIG. 1 and FIG. 2, a modular uninterruptible power supply (UPS) system 1 is provided. The modular uninterruptible power supply (UPS) system 1 includes a housing 20, a plurality of slots 30, a plurality of power modules 40 and a plurality of battery modules 50. The plurality of slots 30 are formed inside the housing 20. The plurality of slots 30 are mutually arranged side by side and each slot 30 can accommodate one power module 40 or one battery module 50. A control unit 10 is further disposed on the top of the housing 20 and has a control panel 11 to provide users with system information of the modular UPS system for operation.

The plurality of slots 30 in the housing 20 are designed to have the identical size. Each power module 40 has a power module case 41, and each battery module 50 has a battery module case 51. The power module cases 41 and the battery module cases 51 are designed to have the same shapes and sizes which match the slots 30. Each slot 30 can accommodate the power module case 41 or the battery module case 51; therefore, each power module 40 and each battery module 50 can be selectively inserted into any one of the plurality of slots 30.

The housing 20 further includes a back panel 21 and two side walls 25 which are respectively disposed on both sides of the back panel 21. A plurality of guide members 24 are disposed on the inner side of the two side walls 25 of the housing 20. Each of the plurality of guide members 24 is disposed on the two side walls 25 corresponding to the boundary of the two neighboring slots 30 to space out each slot 30 and to guide the power module 40 or the battery module 50 into the slot 30.

The back panel 21 is disposed at the back side of the housing 20, and the back of the power module 40 and the battery module 50 are close to the back panel 21 when inserted into the slots 30.

Figure 3:
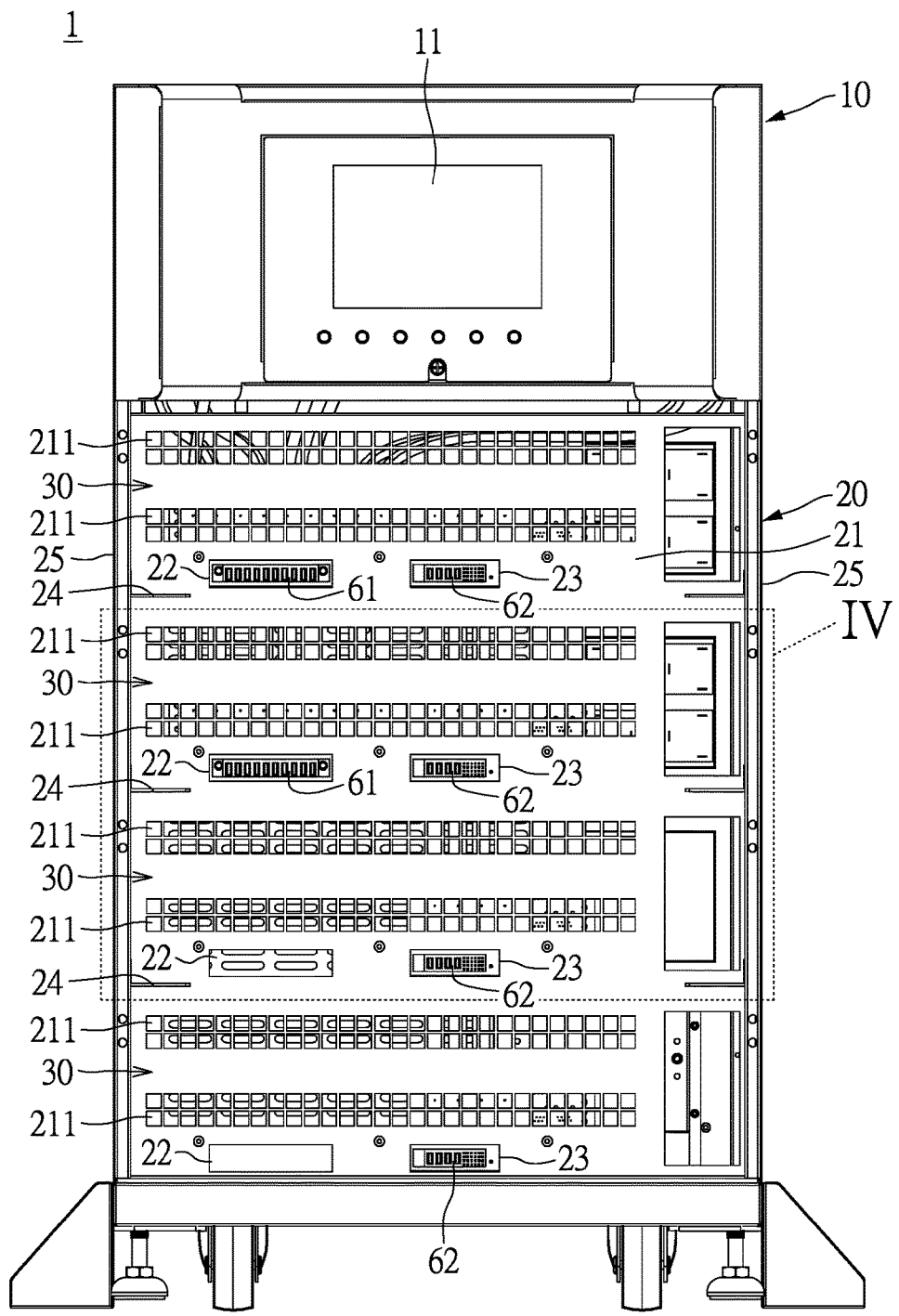
FIG. 3 is a front view of the modular UPS system in which the power module, the battery module and a part of the side wall of the housing are removed according to the first embodiment of the present disclosure.
Figure 4:
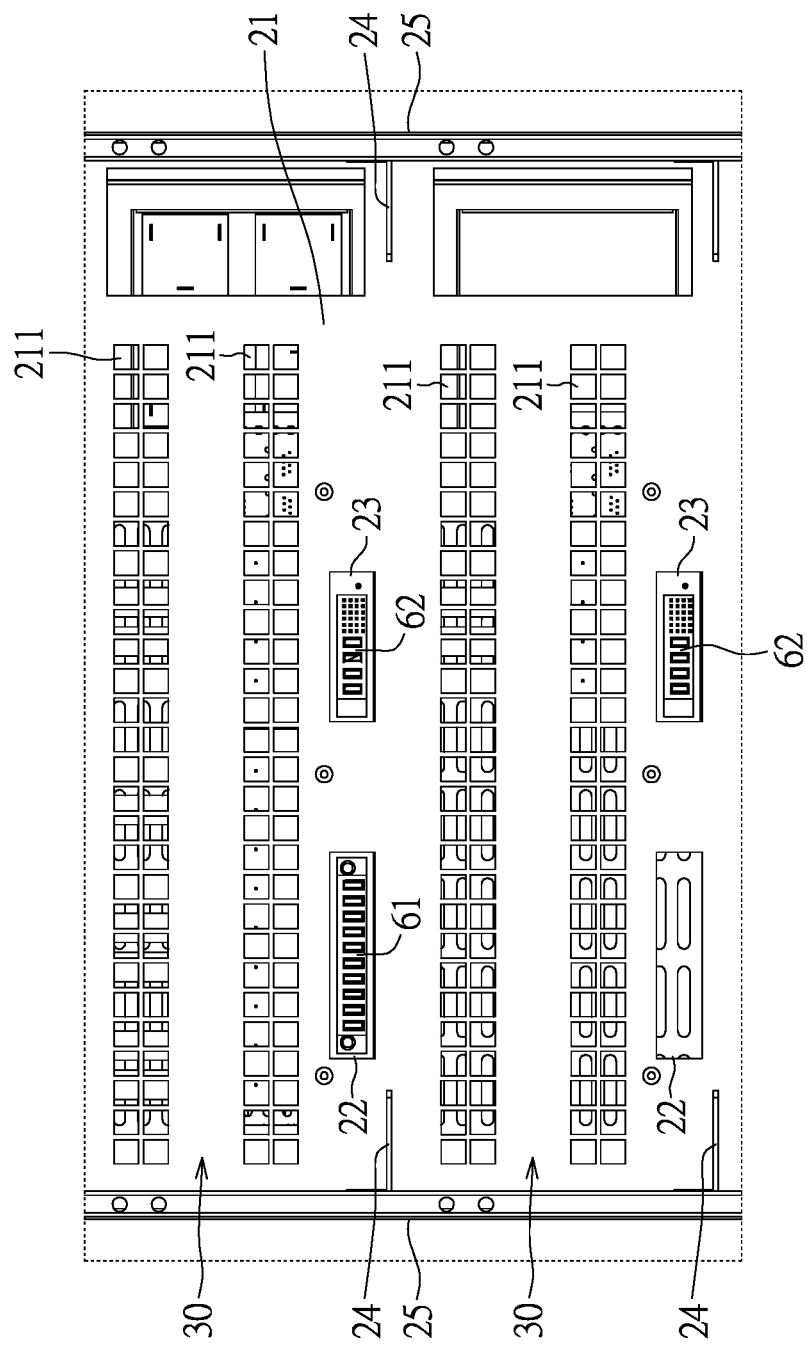
FIG. 4 is a partial enlarged view of the modular UPS system shown in FIG. 3.

As shown in FIG. 2 to FIG. 4, a plurality of first connectors 61 and a plurality of second connectors 62 are disposed on the back panel 21, and each of the plurality of first connectors 61 and each of the plurality of second connectors 62 are disposed corresponding to each slot 30. A plurality of first openings 22 and a plurality of second openings 23 are disposed on the back panel 21, and each of the plurality of first openings 22 and each of the plurality of second openings 23 correspond to each slot 30. Each of the plurality of first openings 22 exposes each of the plurality of first connectors 61, and each of the plurality of second openings 23 exposes each of the plurality of second connectors 62 so that the first connectors 61 and the second connectors 62 face toward the front side of the back panel 21, when the first connectors 61 and the second connectors 62 are mounted on the back panel 21.

As shown in FIG. 2 and FIG. 3, the first connector 61 and the second connector 62 are horizontally disposed side by side, when the first connector 61 and the second connector 62 are disposed in the first opening 22 and the second opening 23, respectively. From the front view of the housing 20, each first connector 61 in each slot 30 is arranged along a vertical direction, and each second connector 62 in each slot 30 is arranged along a vertical direction as well.

Figure 7:
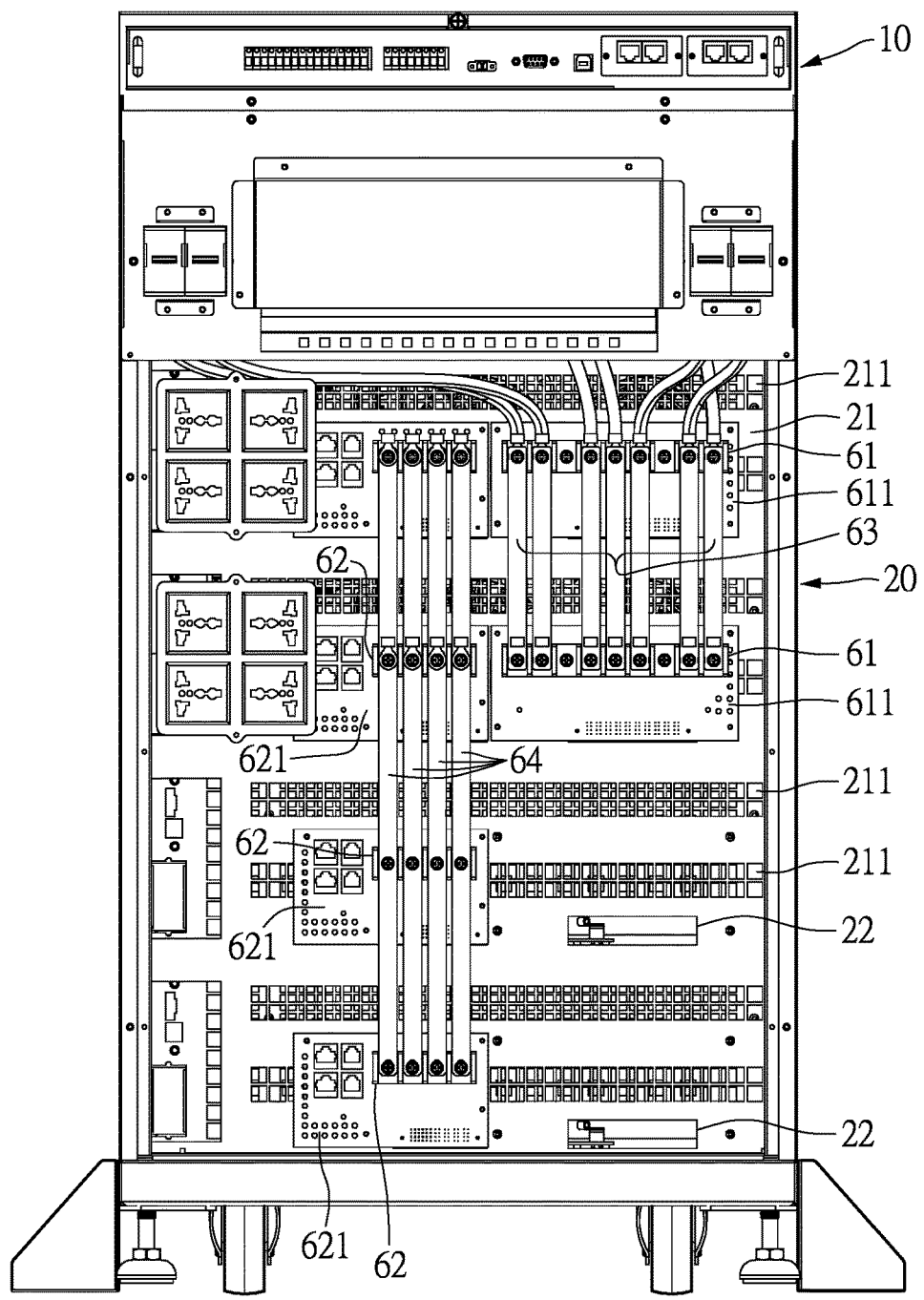
FIG. 7 is a back view of the modular UPS system of which the back panel is partially removed according to the present disclosure.

As shown in FIG. 7, each of the plurality of first connectors 61 is respectively disposed on a first connecting plate 611, and each of the plurality of second connector 62 is respectively disposed on a second connecting plate 621. The first connector 61 and the second connector 62 can be mounted on the back panel 21 corresponding to each of the plurality of first opening 22 and each of the plurality of second opening 23 through the first connecting plate 611 and the second connecting plate 621, respectively. Therefore, each of the plurality of first connectors 61 and each of the plurality of second connectors 62 individually form a detachable connecting module. A first serial copper bus bars 63 and a second serial copper bus bars 64 are disposed on the back of the housing 20. The plurality of first connectors 61 are connected to each other by the first serial copper bus bars 63; the plurality of second connectors 62 are connected to each other by the second serial copper bus bars 64. The plurality of first connectors 61 in slots 30 are connected to each other through the first serial copper bus bars 63, and the plurality of second connectors 62 in slots 30 are connected to each other through the second serial copper bus bars 64.

Figure 5:
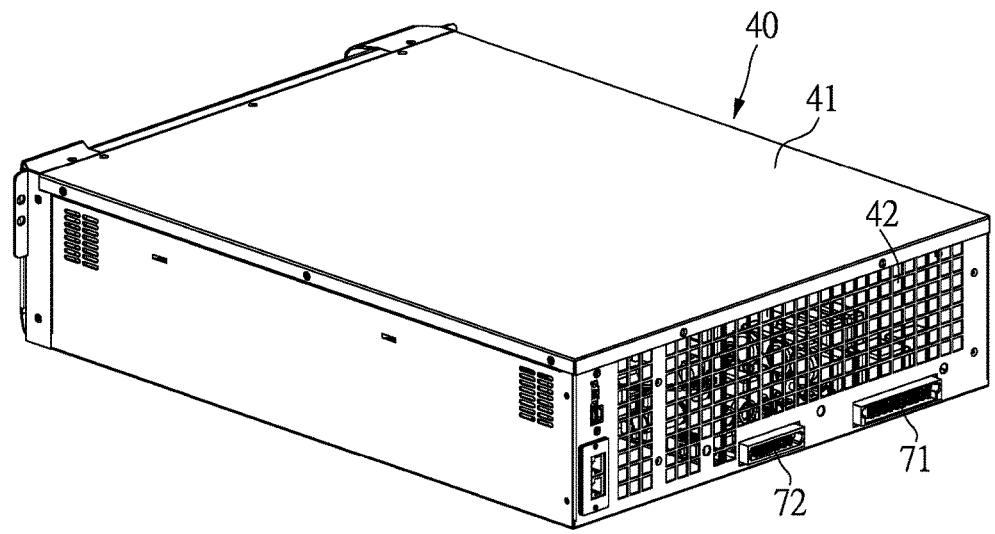
FIG. 5 is a three-dimensional view taken from the back of the power module according to the present disclosure.
Figure 6:
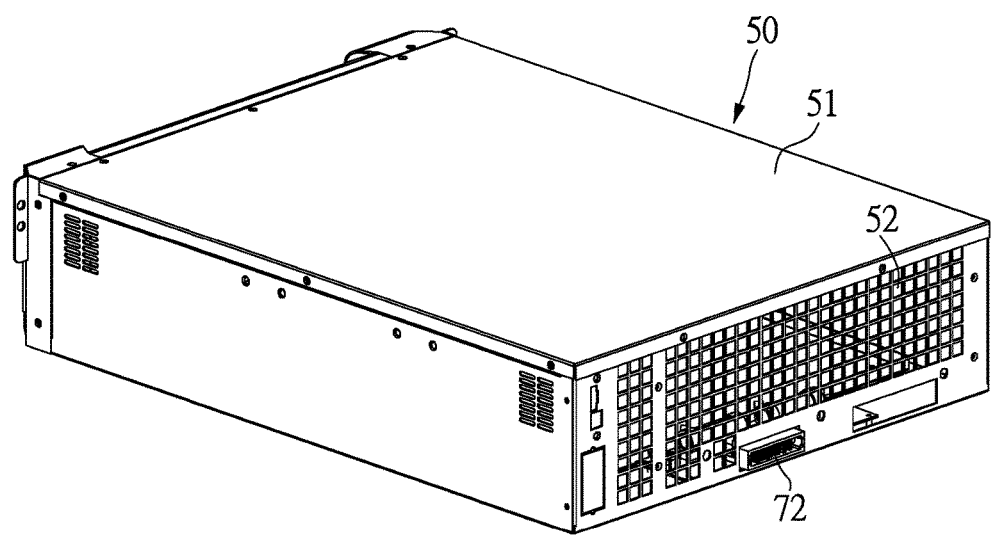
FIG. 6 is a three-dimensional view taken from the back of the battery module according to the present disclosure.

As shown in FIG. 5 and FIG. 6, the power module 40 has the power module case 41, and the battery module 50 has the battery module case 51. The power module case 41 and the battery module case 51 are designed to have a shape and a size corresponding to that of each slot 30, so as to allow the power module case 41 and the battery module case 51 to be inserted into the slot 30. Since the power module case 41 and the battery module case 51 have the identical sizes and shapes, the insertion position of the power module 40 and the battery module 50 in slots 30 of the housing 20 is not limited to the sizes and shapes of the housing 20, so as to increase the installation flexibility.

Referring to FIG. 5, a first connecting module 71 is disposed on the back of the power module case 41 corresponding to the first connector 61, and a second connecting module 72 is disposed on the back of the power module case 41 corresponding to the second connector 62. The first connecting module 71 can be electrically connected to the first connector 61 on the back panel 21, and the second connecting module 72 can be electrically connected to the second connector 62 on the back panel 21 when the power module 40 is inserted into the slot 30. As shown in FIG. 6, the battery module 50 of the present disclosure has sockets of the second connector 62 as the power module 40 does, and the second connecting module 72 is disposed on the back of the battery module 50 of the present disclosure, so that the battery module 50 is electrically connected to the second connector 62 through the second connecting module 72.

Reference is made to FIG. 3 and FIG. 4. According to the first embodiment of the present disclosure, the first connector 61 and the second connector 62 are both installed in the slot 30 assigned to the power module 40, so as to form a first type slot that can accommodate the power module 40. Further, only the second connector 62 is disposed at the slot 30 assigned to the battery module 50, so as to form a second type slot suitable for the battery module 50. Hence, the modular uninterruptible power supply (UPS) system 1 of the first embodiment of the present disclosure can selectively equip the first connector 61 and the second connector 62 in a non-specific slot 30 of the housing 20, such that the slot 30 can be formed as the first type slot for disposing the power module 40 (the upper slot 30 in FIG. 4). Alternatively, only the second connector 62 is disposed on the back panel 21, such that the slot 30 can be formed as the second type slot for disposing the battery module 50 (the lower slot 30 in FIG. 4). The present disclosure can achieve the adaptive change as mentioned above by merely adjusting the position of the first connector 61 and the second connector 62 in the slots 30, without changing structures and spaces of the housing 20 and slots 30. Therefore, the modular UPS system 1 of the present disclosure has higher operating flexibility.

Furthermore, a mesh first case cooling hole 42 is disposed on the back of the power module case 41, and a mesh second case cooling hole 52 is disposed on the back of the battery module case 51, as shown in FIG. 2, FIG. 5 and FIG. 6. In addition, a plurality of housing cooling holes 211 are disposed on the back panel 21 of the housing 20 corresponding to each slot 30, and the position of each housing cooling hole 211 corresponds to the first case cooling hole 42 of each power module 40 and the second case cooling hole 52 of each battery module 50. When the power module 40 and the battery module 50 are inserted into the slots 30, the first case cooling hole 42 of the power module 40 and the second case cooling hole 52 of the battery module 50, respectively, can align with each of the plurality of housing cooling holes 211, so as to allow the power module 40 and the battery module 50 to dissipate heat.

The modular UPS system 1 of the first embodiment of the present disclosure can be easily designed, especially for the number of the power module 40 and the battery module 50 disposed in the housing 20, to meet user needs.

Figure 8:
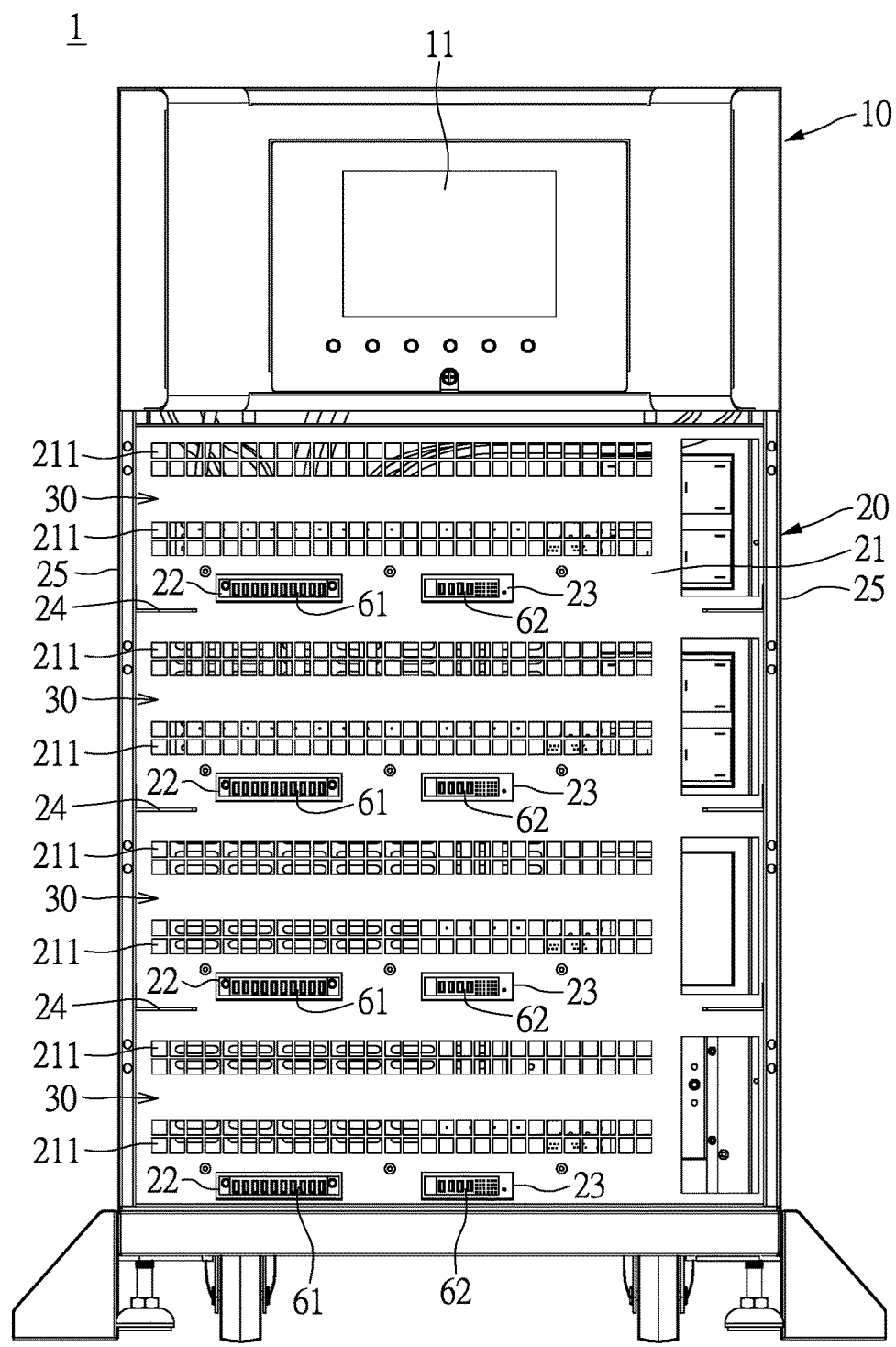
FIG. 8 is a front view of the modular UPS system according to a second embodiment of the present disclosure.

Reference is made to FIG. 8. According to the second embodiment of the present disclosure, the basic structure of the modular uninterruptible power supply (UPS) system 1 of the second embodiment is the same as that of the first embodiment, and thus the identical elements and features are omitted herein for the sake of brevity.

According to the second embodiment, the first connector 61 and the second connector 62 are both disposed in each slot 30 of the housing 20, such that the power module 40 and the battery module 50 can be alternatively and selectively inserted into the single slot 30. When the power module 40 is inserted into the slot 30, the first connecting module 71 and the second connecting module 72 are electrically connected to the first connector 61 and the second connector 62 in each slot 30, respectively. When the battery module 50 is inserted into the slot 30, only the second connecting module 72 is electrically connected to the second connector 62 in the slot 30.

In other words, the first connector 61 and the second connector 62 are both reserved in each of the plurality of slots 30 according to the second embodiment. When the power module 40 is inserted into the slot 30, the first connector 61 and the second connector 62 of the slot 30 are connected to the power module 40 simultaneously. Furthermore, the battery module 50 merely connects to the second connector 62 when the battery module 50 is inserted into the slot 30. Hence, the power module 40 and the battery module 50 can be electrically connected to the modular UPS system 1, no matter which one is inserted into the slot 30.

Compared with the first embodiment of the present disclosure, although the first connector 61 in the slot 30 assigned for the battery module 50 is not used, the housing 20 of the second embodiment can allow the power module 40 and the battery module 50 to be randomly inserted into any slot 30 without changing the hardware structure, which allows users to adjust and arrange the number of the power module 40 and the battery module 50 installed in the housing 20, so as to increase the operating flexibility.

Figure 9:
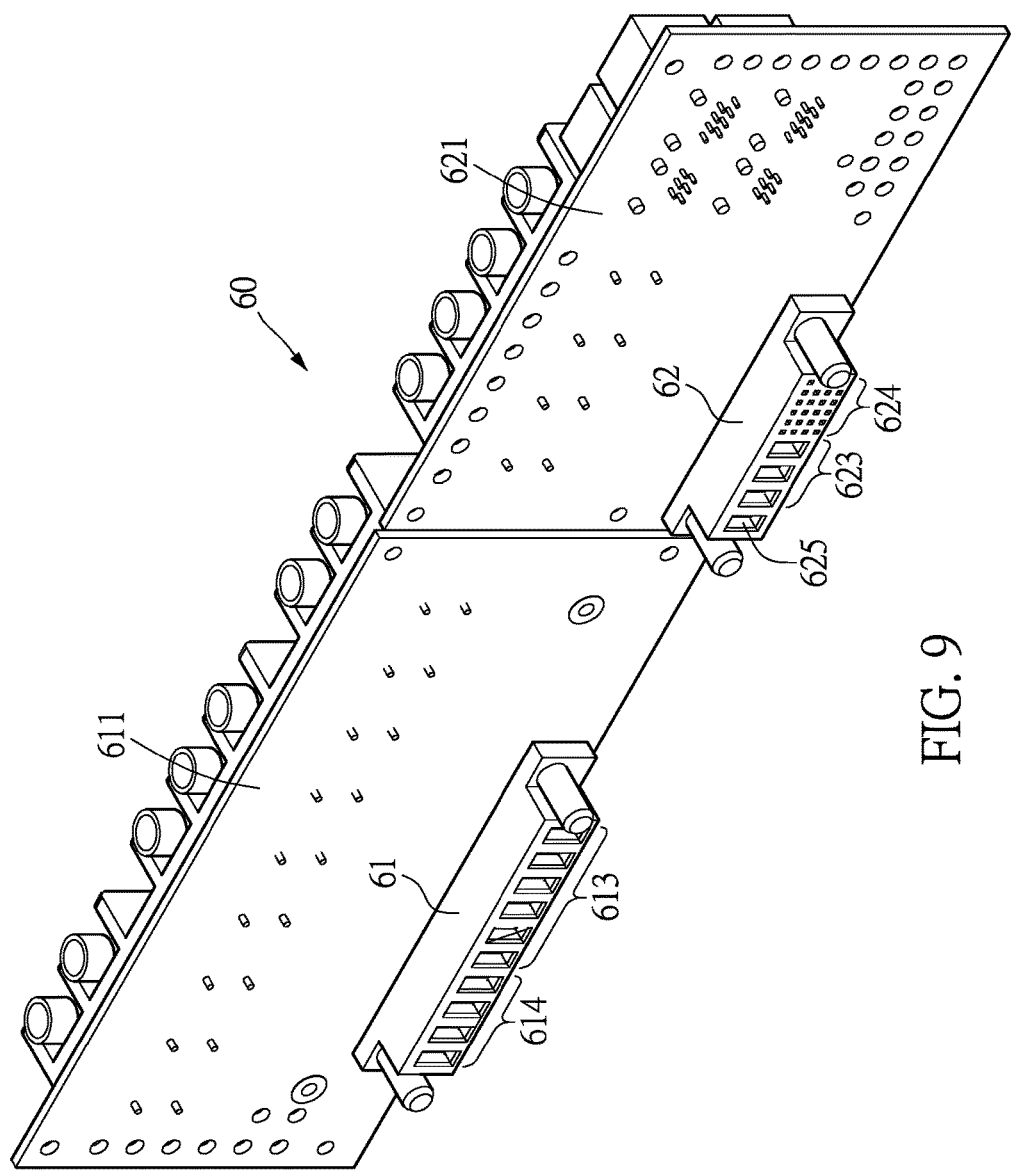
FIG. 9 is a three-dimensional view taken from the front of the connecting module according to the present disclosure.
Figure 10:
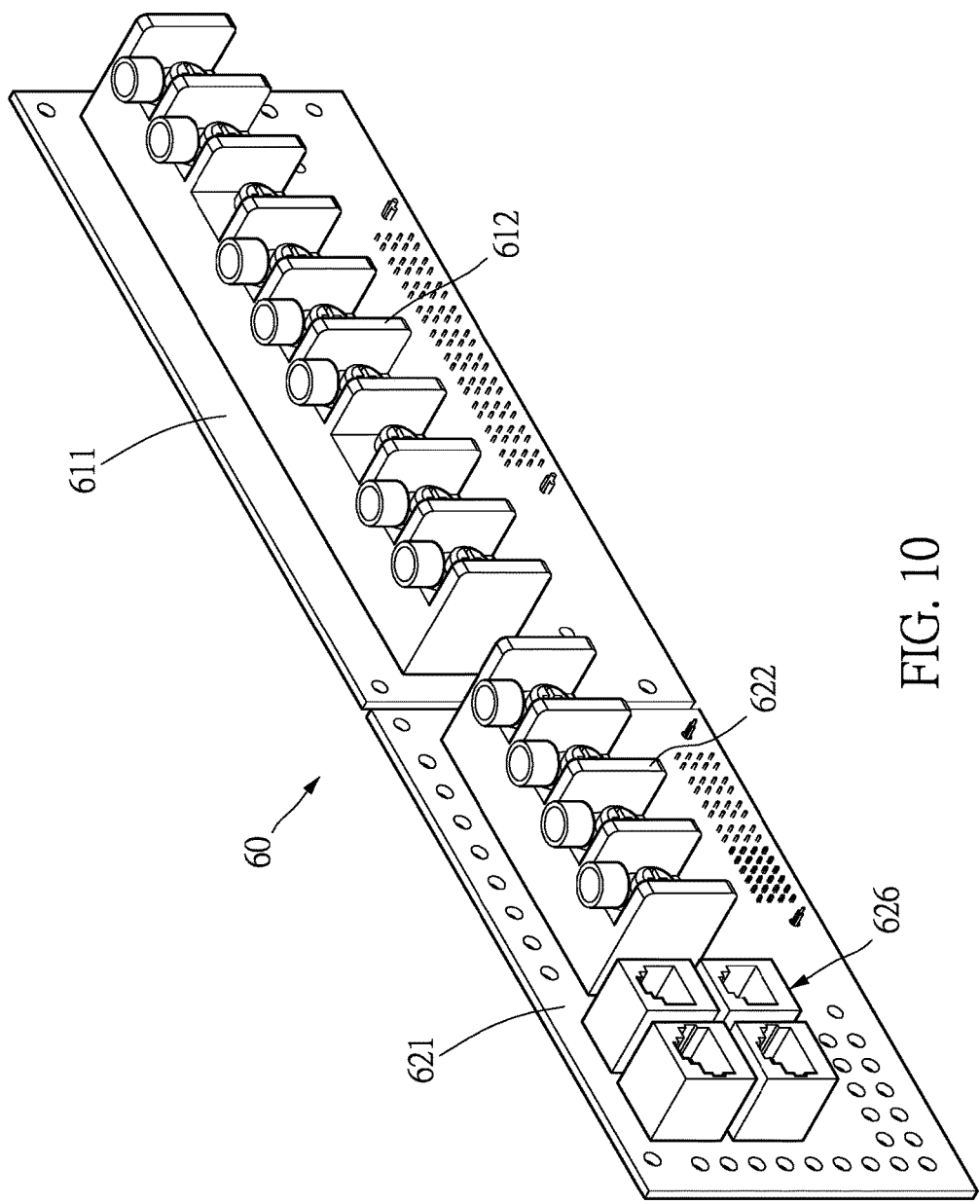
FIG. 10 is a three-dimensional view taken from the back of the connecting module according to the present disclosure.

Referring to FIGS. 9 to 12, the first connector 61, the second connector 62 and the structure of connecting modules utilized by the power module 40 and the battery module 50 of the present disclosure are further described. As shown in FIG. 9 and FIG. 10, the first connector 61 and the second connector 62 of the present disclosure form a connecting module 60. The first connector 61 and the second connector 62 are disposed at one side of the first connecting plate 611 and the second connecting plate 621, respectively. A first serial bus connector 612 and a second serial bus connector 622 are disposed respectively at the other side of the first connector 61 and the second connector 62 opposite to the first connecting plate 611 and the second connecting plate 621, to connect to the first serial copper bus bars 63 and the second serial copper bus bars 64. Hence, the first connector 61 is electrically connected to the first serial copper bus bars 63, and the second connector 62 is electrically connected to the second serial copper bus bars 64. In addition, a plurality of communication ports 626 are disposed on the second connecting plate 621.

Figure 11:
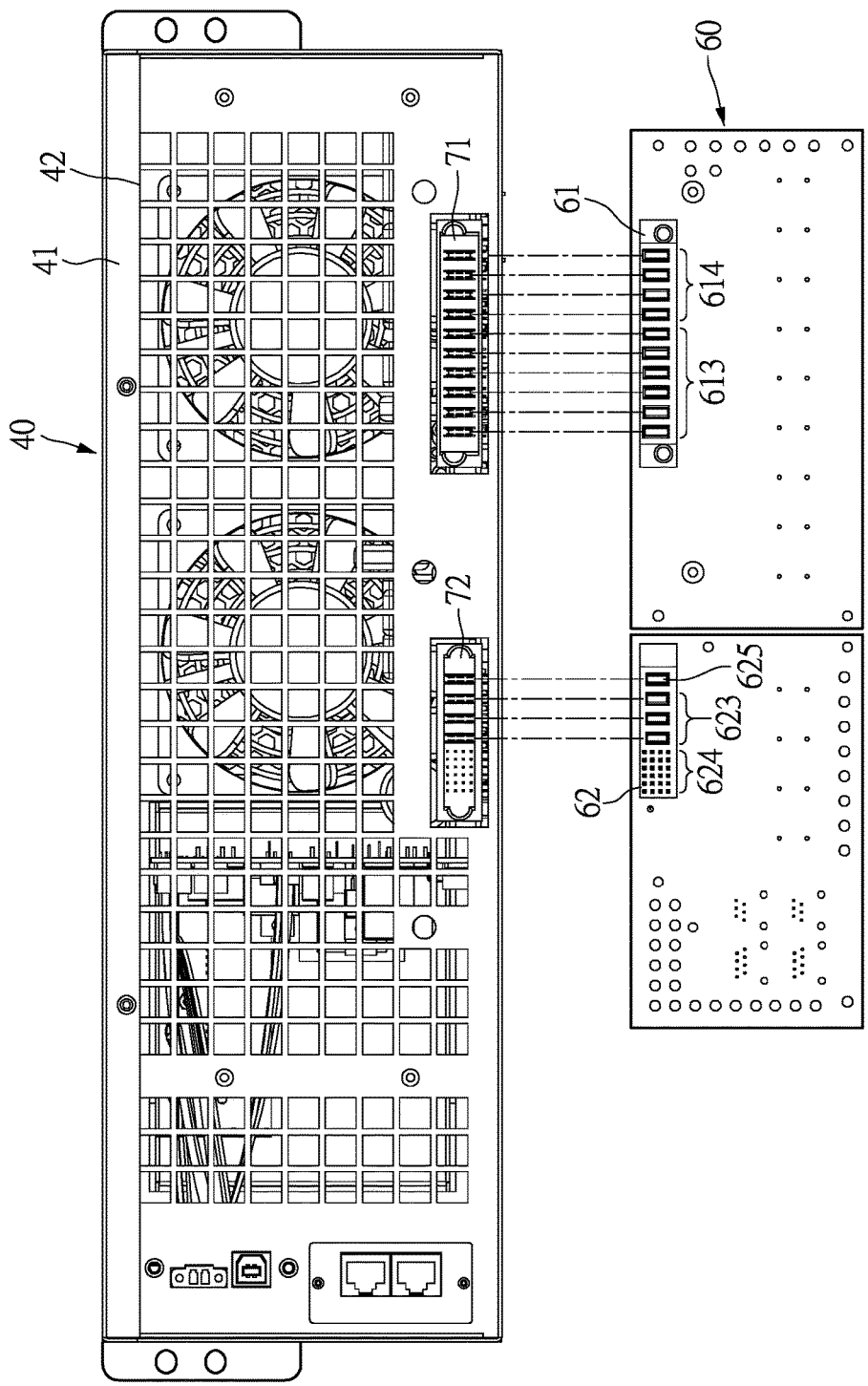
FIG. 11 is a schematic view showing the connection between each socket of the first connecting module and the second connecting module of the power module and the first connector and the second connector of the connecting module according to the present disclosure.
Figure 12:
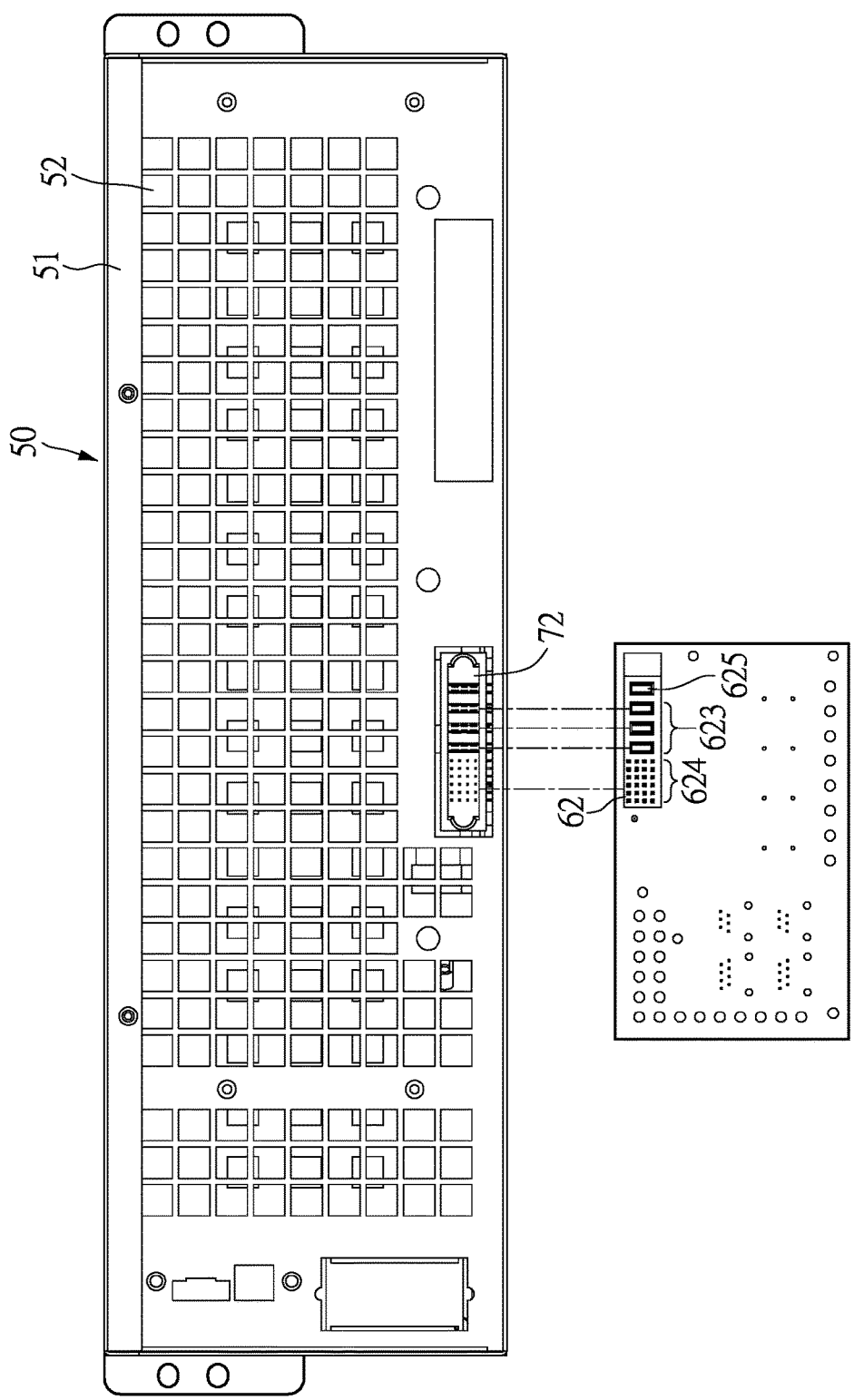
FIG. 12 is a schematic view showing the connection between each socket of the second connecting module of the battery module and the second connector of the connecting module according to the present disclosure.

As shown in FIG. 11 and FIG. 12, in order to achieve that the connecting module 60 corresponding to each slot 30 can be electrically connected to the power module 40 and the battery module 50, the connecting sockets of the first connector 61, the second connector 62, the first connecting module 71 and the second connecting module 72 on the power module 40 and the battery module 50 are arranged as follows. As shown in FIG. 9, FIGS. 11 and 12, the multiple sockets on the first connector 61 of the present disclosure include a plurality of AC input sockets 613 and a plurality of AC output sockets 614. In addition, a plurality of DC input sockets 623 and a plurality of communication connection sockets 624 are disposed on the second connector 62.

The number of sockets of the plurality of AC input sockets 613 and the plurality of AC output sockets 614 disposed on the first connector 61 can be adjusted according to actual demands of the uninterruptible power supply systems, and the present disclosure is not limited thereto. Further, at least one additional socket 625 can be disposed on the second connector 62, in addition to the plurality of DC input sockets 623 and the plurality of communication connection sockets 624. According to the embodiment of the present disclosure, the additional socket 625 can be used as another AC output socket or AC input socket. A part of the DC input sockets and a part of the DC output sockets are disposed on the second connector 62 through the additional socket 625, so as to reduce the number of sockets of the first connector 61.

As shown in FIG. 11, the first connecting module 71 and the second connecting module 72 are disposed on the back of the power module 40 to connect with the first connector 61 and the second connector 62, respectively. The power module 40 achieves electrical connection by connecting the first connecting module 71 and the second connecting module 72 to the plurality of AC input sockets 613, the plurality of AC output sockets 614, the plurality of DC input sockets 623 and the plurality of communication connection sockets 624 of the first connector 61 and the second connector 62. As shown in FIG. 12, only the second connecting module 72 is disposed on the back of the battery module 50, and the battery module 50 is electrically connected to the DC input sockets 623 of the second connector 62 merely by the second connecting module 72.

The power module 40 and the battery module 50 of the present disclosure have connections through the same connecting module 60 by virtue of the features mentioned above, and each slot 30 of the modular UPS system 1 can accommodate either the power module 40 or the battery module 50, such that the design of the connecting module of the modular UPS system 1 can be simplified.

In summary, the benefit of the present disclosure is that the modular design of the present disclosure increases the operating flexibility of the modular UPS system 1 and allows the modular UPS system 1 to be upgraded easily, since the number of the power module 40 and/or battery module 50 of the modular UPS system 1 of the present disclosure can be disposed in the housing 20 without changing its structure.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present invention delineated by the following claims.

What is claimed is:

1. A modular uninterruptible power supply (UPS) system, comprising:
a housing, in which a plurality of slots are disposed;
at least one power module selectively inserted into one of the plurality of slots;
at least one battery module selectively inserted into one of the plurality of slots;
a plurality of first connectors, wherein each of the first connectors is selectively disposed in each of the slots; and
a plurality of second connectors, wherein each of the second connectors is individually disposed in each of the slots;
wherein the slot which accommodates the at least one power module is defined as a first type slot, and the slot which accommodates the at least one battery module is defined as a second type slot;
wherein the first type slot is disposed with one first connector and one second connector, and the second type slot is disposed with one second connector of which a position corresponds to a position of the second connector in the first type slot;
wherein the at least one power module is disposed with a first connecting module and a second connecting module corresponding to the first connector and the second connector, respectively; the first connecting module is electrically connected to the first connector and the second connecting module is electrically connected to the second connector when the at least one power module is inserted into one of the slots; and
wherein the at least one battery module is disposed with a second connecting module corresponding to the second connector; the second connecting module on the at least one battery module is electrically connected to the second connector when the at least one battery module is inserted into one of the slots.

2. The modular UPS system according to claim 1, wherein each of the first connectors has a plurality of AC input sockets and a plurality of AC output sockets, each of the second connectors has a plurality of DC input sockets and a plurality of communication connection sockets; each of the power modules is electrically connected to the plurality of AC input sockets and the plurality of AC output sockets of the first connector through the first connecting module, and is electrically connected to the plurality of DC input sockets and the plurality of communication connection sockets through the second connecting module; and each of the battery modules is electrically connected to the plurality of DC input sockets of the second connector though the second connecting module.

3. The modular UPS system according to claim 1, wherein the housing further includes a back panel; when the at least one power module and the at least one battery module are inserted into the slots, the back of the at least one power module and the back of the at least one battery module are close to the back panel; the back panel is disposed with a plurality of first openings and a plurality of second openings corresponding to the first connectors and the second connectors of the slots, respectively, and each of the first connectors is selectively disposed in each of the first openings and each of the second connectors is respectively disposed in each of the second openings.

4. The modular UPS system according to claim 3, wherein each of the first connectors is disposed on a first connecting plate and on the first opening through the first connecting plate; each of the second connectors is disposed on a second connecting plate and on the second opening through the second connecting plate.

5. The modular UPS system according to claim 4, wherein a first serial bus connector is disposed on a side of the plurality of first connecting plates opposite to the first connector, a second serial bus connector is disposed on a side of the plurality of second connecting plates opposite to the second connector; the first serial bus connector on the first connecting plate is electrically connected to the first connector on the first connecting plate; the second serial bus connector on the second connecting plate is electrically connected to the second connector on the second connecting plate; a plurality of first serial bus connectors are connected to each other through a first serial copper bus bars, and a plurality of second serial bus connectors are connected to each other through a second serial copper bus bars.

6. The modular UPS system according to claim 1, wherein each of the power modules and each of the battery modules have a power module case and a battery module case, respectively; and the power module case and the battery module case are formed to complement each of slots and to have the shapes and sizes being able to insert into the slots.

7. The modular UPS system according to claim 6, wherein the back is disposed with a housing cooling holes corresponding to each of the slots, the back of the power module case and the back of the battery module case facing the back panel are respectively disposed with a first case cooling holes and a second case cooling holes; the first case cooling holes and the second case cooling holes respectively correspond to the plurality of the housing cooling holes when the power module and the battery module are inserted into the slots.

8. A modular uninterruptible power supply (UPS) system, comprising:
a housing, in which a plurality of slots are disposed;
at least one power module selectively inserted into one of the plurality of slots; and
at least one battery module selectively inserted into one of the plurality of slots;
wherein the housing in each of the slots is disposed with a first connector and a second connector;
wherein the at least one power module is disposed with a first connecting module and a second connecting module corresponding to the first connector and the second connector, respectively; the first connecting module is electrically connected to the first connector and the second connecting module is electrically connected to the second connector when the at least one power module is inserted into one of the slots;
wherein the at least one battery module is disposed with a second connecting module corresponding to the second connector; the second connecting module on the at least one battery module is electrically connected to the second connector when the at least one battery module is inserted into one of the slots.

9. The modular UPS system according to claim 8, wherein each of the first connectors has a plurality of AC input sockets and a plurality of AC output sockets, each of the second connectors has a plurality of DC input sockets and a plurality of communication connection sockets; each of the power modules is electrically connected to the plurality of AC input sockets and the plurality of AC output sockets of the first connector through the first connecting module, and is electrically connected to the plurality of DC input sockets and the plurality of communication connection sockets through the second connecting module; and each of the battery modules is electrically connected to the plurality of DC input sockets of the second connector though the second connecting module.

10. The modular UPS system according to claim 8, wherein the housing further includes a back panel; when the at least one power module and the at least one battery module are inserted into the slots, the back of the at least one power module and the back of the at least one battery module are close to the back panel; the back panel is disposed with a plurality of first openings and a plurality of second openings corresponding to the first connectors and the second connectors of the slots, respectively, and each of the first connectors is selectively disposed in each of the first openings and each of the second connectors is respectively disposed in each of the second openings.

11. The modular UPS system according to claim 10, wherein each of the first connectors is disposed on a first connecting plate and on the first opening through the first connecting plate; each of the second connectors is disposed on a second connecting plate and on the second opening through the second connecting plate.

12. The modular UPS system according to claim 11, wherein a first serial bus connector is disposed on a side of the plurality of first connecting plates opposite to the first connector, a second serial bus connector is disposed on a side of the plurality of second connecting plates opposite to the second connector; the first serial bus connector on the first connecting plate is electrically connected to the first connector on the first connecting plate; the second serial bus connector on the second connecting plate is electrically connected to the second connector on the second connecting plate; a plurality of first serial bus connectors are connected to each other through a first serial copper bus bars, and a plurality of second serial bus connectors are connected to each other through a second serial copper bus bars.

* * * * *